United States Patent [19]

Aden et al.

[11] Patent Number: 4,809,428
[45] Date of Patent: Mar. 7, 1989

[54] THIN FILM DEVICE FOR AN INK JET PRINTHEAD AND PROCESS FOR THE MANUFACTURING SAME

[75] Inventors: James S. Aden; Jeffrey A. Kahn, both of Corvallis, Oreg.

[73] Assignee: Hewlett-Packard Company, Palo Alto, Calif.

[21] Appl. No.: 131,620

[22] Filed: Dec. 10, 1987

[51] Int. Cl.$^4$ ................. H01C 17/06; H05K 3/00
[52] U.S. Cl. ..................................... 29/611; 29/620; 29/829; 29/610.1; 346/140 R
[58] Field of Search .............. 29/610 R, 611, 620, 29/825, 829; 346/140

[56] References Cited

U.S. PATENT DOCUMENTS

| | | | |
|---|---|---|---|
| 4,446,355 | 5/1984 | Sato et al. | 29/611 X |
| 4,683,646 | 8/1987 | Kando et al. | 29/61 |
| 4,695,853 | 9/1987 | Hackleman et al. | 29/611 X |

Primary Examiner—Timothy V. Eley
Assistant Examiner—Taylor J. Ross
Attorney, Agent, or Firm—William J. Bethurum

[57] ABSTRACT

A process for manufacturing a thin film resistor substrate useful, for example, in fabricating an ink jet printhead, wherein discontinuous strips of conductive material are initially patterned on the surface of a resistive layer. These strips are formed using a first series of masking and etching steps of define an "X" dimension of a resistive heater element. Then, the conductive strips and resistive material therebetween are completely masked in preparation for a subsequent, second etching step used to remove the exposed portions of the resistive layer and thereby define a "Y" dimension of the resistive heater element. These steps leave smooth contours, good step coverage and high quality bevelled edges of the thus defined conductive and resistive layers. These layers are now ready for subsequent passivation layer, barrier layer and orifice plate deposition processes to complete a thin film printhead for use in an ink jet printer.

4 Claims, 2 Drawing Sheets

THIN FILM DEVICE FOR AN INK JET PRINTHEAD AND PROCESS FOR THE MANUFACTURING SAME

TECHNICAL FIELD

This invention relates generally to the fabrication of printheads for ink jet printers and more particularly to a new and improved thin film type printhead and related manufacturing process for a thermal ink jet (TIJ) printer.

BACKGROUND ART

In the manufacture and use of thin film resistor (TFR) type printheads for use in thermal ink jet printers, it is well known to employ resistive heater elements to heat ink to boiling and thus propel the ink through an overlying orifice plate during an ink jet printing operation. The resistive heater material is typically disposed on an insulating substrate, and the individual heater elements therein are dimensionally defined by conductive trace patterns which are photolithographically formed using conventional photolithographic masking, ultraviolet exposure and etching techniques well known in the art. This thin film printhead substructure is affixed to an intermediate barrier layer and outer orifice plate, and typically the internal geometry of the barrier layer will define a plurality of ink reservoirs which are situated above and aligned with a corresponding plurality of heater resistors. For a further discussion of these types of thin film printhead structures, reference may be made to the *Hewlett-Packard Journal*, Vol. 38, No. 5, May 1985, incorporated herein by reference.

One conventional prior art process for defining the X-Y dimensions of these heater resistors involves first depositing successive layers of resistive and conductive material on an insulating substrate and then using a single photoresist mask to first define only the width of the conductive strips in the outer conductive pattern. This photoresist mask also serves as an etch mask for the underlying resistive layer and defines a first dimension of a resistive heater element. After etching exposed areas of the resistive area and leaving a strip of resistive material intact beneath an outer strip of conductive material, another set of masking and etching steps is used to form openings in the conductive strips to thereby establish a second dimension of the resistive heater element.

Since the first two etches in the above process use the same photoresist mask, pattern degradation occurring during the first etch step undesirably affects the quality of the second etch. Additionally, the etchant used for the bottom layer (resistive layer) attacks the freshly exposed edges of the top layer (conductor layer), giving rise to a variety of defect possiblities. The second masking and etching step which defines the second dimension of the resistive heater element as described above also suffers from a condition caused by etching the conductor layer which has undergone surface modifications. These modifications are caused by exposure to the chemicals involved in the first masking and etching step, including trace quantities of the organic residues from the photoresist material. This latter fact manifests itself in an irregular bevel quality at the resistor/conductor interface.

DISCLOSURE OF INVENTION

The general purpose of this invention is to provide a new and improved manufacturing process for fabricating thin film ink jet printheads which eliminates the above described disadvantages of conventional prior art processing while simultaneously increasing process yields, reducing process costs, improving printhead to printhead identity of device characteristics and performance, and increasing printhead lifetime.

To accomplish this purpose, we have discovered and developed a new and improved ink jet printhead and manufacturing process therefor which includes forming a layer of resistive material on top of a selected substrate and then forming a layer of conductive material on top of the resistive layer. Then, a conductive trace pattern is completely formed in the conductive layer and includes discontinuous strips of conductive material which extend to each side of and define a first dimension of a resistive heater element. Then, these conductive strips of the conductive trace pattern are completely covered with a mask to thereby leave exposed a predetermined area of the hitherto undefined resistive material. Then, the exposed area of the resistive layer is removed, such as by etching, to thus define a second dimension of the resistive heater element and thereby leave extremely well defined and smoothly contoured side walls and edges of both the resistive material and the conductive material.

Thus, among the many advantages of this invention includes the provision of smooth, well controlled conductor edge profiles exhibiting good bevel quality which is important in thermal ink jet processing. These edge profiles provide for enhanced passivation step coverage over conductor edges, and such passivation step coverage is crucial for thermal ink jet reliability due to the substantial thermal, mechanical and chemical stresses to which these devices are subjected during a thermal ink jet printing operation. It is well documented that a smooth transition between the conductor material and the resistor material is imperative to long pen life.

In the present two-step process, the trace conductors are defined and bevels are generated in a single etch step at the first mask level. In this step only one metallic layer is affected. Since the conductor is newly formed, etching it produces uniform and smooth bevels as will be more fully described, and this feature eliminates localized edge pitting, lateral edge waviness and etch damaged photoresist residues.

Using the present process, critical conductor dimensions are more readily controllable due to the fact that only one etchant affects the conductor dimensions. The second mask and etch step only etches the resistor layer, and in contrast to the conventional prior art process, the resistor layer has no edges that lie beneath metal strips. This feature eliminates the common edge problems as described above.

The enhanced process described herein allows the creation of two distinct edge steps and thereby eliminates the possibility of conductor edges overhanging the edges of the resistor layer. Additionally, this process eliminates the constraints on selectivity of the resistor layer etchant, since this etchant can be modified and optimized independently without concern about selectivity to the conductor layer material.

Using the present process, critical resistor dimensions are more readily controllable due to the fact that only one etchant affects the resistor width, and this process eliminates one etch step and the associated quench, rinse, dry and inspection steps associated therewith. In addition, the present process reduces the likelihood of process related corrosion, since the resistor layer etchant is not allowed to inoculate the conductor surface with acid related residues. This latter action occurs with conventional prior art processing because the resistor layer etchant can penetrate through cracks formed in the photoresist mask during the previous conductor layer etch step. Thus, the overall quality and uniformity of the thin film resistor/conductor array patterning is greatly enhanced using the present inventive process.

DETAILED DESCRIPTION OF THE DRAWINGS

Figure 1:
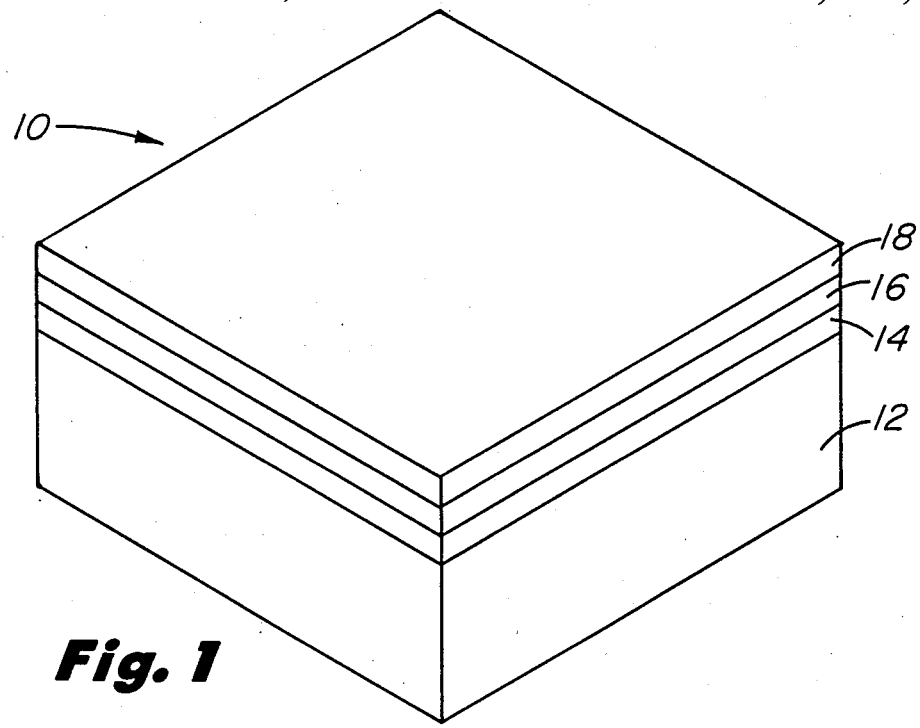
FIG. 1 is an isometric view of one type of thin film substructure upon which the present process may be carried out.

Referring now to FIG. 1, the thin film resistor substructure shown therein is designated generally as 10 and includes an underlying substrate 12 which will typically be glass or silicon. The substrate 12 has a layer 14, such as silicon dioxide, $SiO_2$, thereon, and this surface insulating layer 14 is utilized to provide a dielectric barrier and heat sink between the substrate 12 and an overlying resistive layer 16 which may, for example, be a tantalum aluminum alloy, TaAl. The resistive layer 16 is in turn covered by a top conductive layer 18 which may, for example, be aluminum, Al. However, the conductive layer 18 and the resistive layer 16 may both be of many materials other than the exemplary materials given above. Similarly, it is not necessary that the surface insulation layer 14 be used at all, and instead the resistive layer may be deposited directly on certain types of substrate materials with dielectric and heat transfer characteristics suitable for directly receiving the desired resistive material. One such suitable substrate material is baria glass.

Figure 2A:
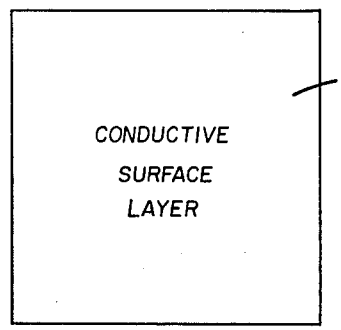
FIGS. 2A through 2D illustrate, in four plan views, the formation of the pattern geometries for the conductive trace material and the resistive material, respectively.
Figure 2B:
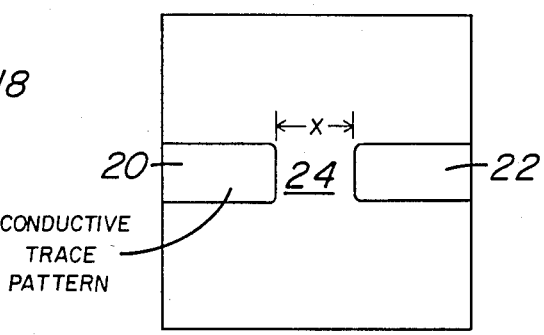

The top conductive surface layer 18 as indicated in FIG. 2A is appropriately masked with strips of photoresist (not shown) using conventional photolithographic processing techniques and then exposed to a metal etchant (such as $H_3PO_4:HNO_3:CH_3COOH:H_2O$ in the ratios of 16:14:1:2, respectively) to remove all unprotected regions of the aluminum conductive layer 18. This step leaves intact a plurality of conductive traces 20 and 22 which define the resistor length dimension "X" as shown in FIG. 2B. In this figure there are shown only two conductive traces 20 and 22, but it will be understood and appreciated by those skilled in the art that a thin film resistor type of printhead structure of the type used in TIJ printers, for example, will include a large plurality of these traces. These traces ultimately serve to define and supply current to a corresponding plurality of heater resistors 24 in the central area indicated in FIG. 2B.

Figure 2C:
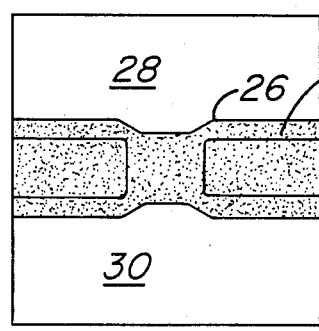

The structure in FIG. 2B is transferred to a photoresist masking station where a second photoresist mask 26 as indicated in FIG. 2C is formed to completely cover the upper surfaces of the conductive traces 20 and 22. After this masking step is completed, the structure in FIG. 2C is then immersed in another selected etchant for removing the exposed unprotected resistive layer in the upper and lower regions 28 and 30 as indicated in FIG. 2C. Then the photoresist mask 26 in FIG. 2C is removed using a suitable resist removal solvent to thereby leave intact the resistive material 34 in FIG. 2D and having the central contoured boundaries 36 and 38 which define a second or width dimension "Y" of the heater resistor 24. Thus, the continuous strip of resistive heater material 34 underlies the conductive traces 20 and 22 and has a larger width dimension than that of these traces.

Figure 2D:
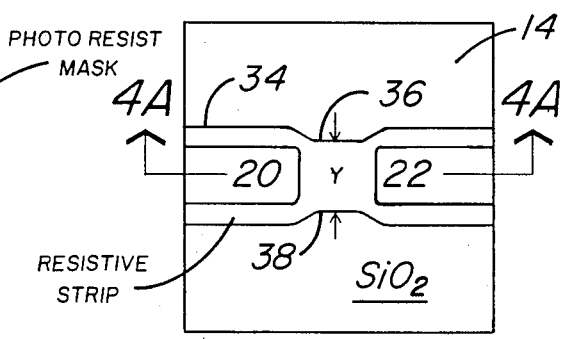
Figure 3:
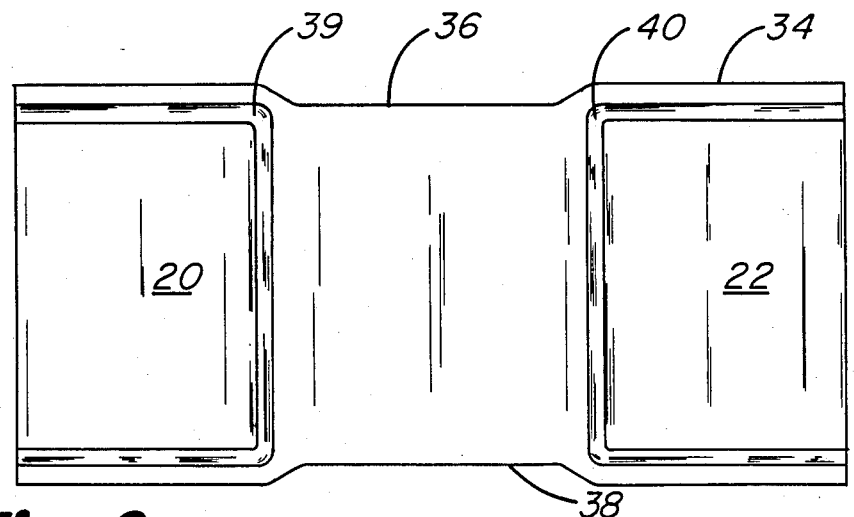
FIG. 3 is a plan view replication of a photograph taken of the resistor and conductor step region of the central region of FIG. 2D after the resistive strips had been defined.

Referring now to FIG. 3, the smooth contours and improved bevelled geometry 39 and 40 of the two-step resistor/conductor structure are shown in a plan view replication of a photograph taken of the horizontal resistor and conductor strips in FIG. 2D. The bevelled edges 39 and 40 have a slope of about twenty (20) degrees with respect to the horizontal and a very smooth surface as a result of undergoing only a single etch step in the above described process.

Figure 4A:
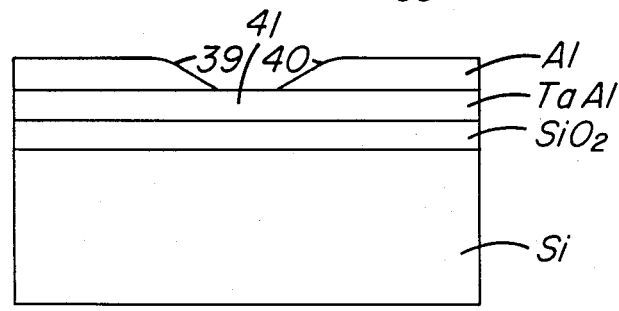
FIG. 4A is a cross section view taken along lines 4A—4A of FIG. 2D.
Figure 4B:
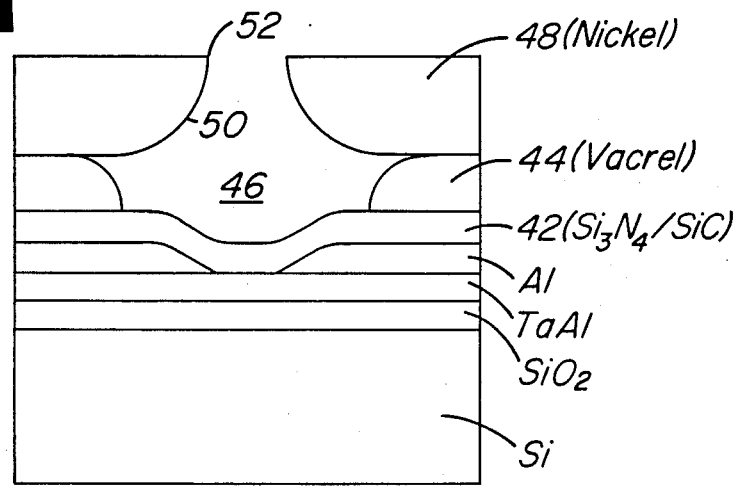
FIG. 4B is a cross section view showing the addition of barrier layer material and an outer orifice plate to the substructure of FIG. 4A.

Referring now to FIG. 4A, this figure is a cross section view taken along lines 4A—4A of FIG. 2D and shows the smooth low angle edges 39 and 40 of the aluminum trace patterns previously described and defining a resistive heater element 41. The structure in FIG. 4A will normally be transferred to an inert passivation deposition station wherein typically an initial thin layer of silicon nitride, $Si_3N_4$, is deposited on the surface of the aluminum trace material and exposed heater resistor. Thereafter, an outer protective layer of highly inert silicon carbide, SiC, is deposited on the surface of the $Si_3N_4$ to complete the composite inner surface passivation layer 42 as indicated in FIG. 4B. Then, a much thicker outer barrier layer 44 is formed on the surface of the surface passivation layer 42, and the outer barrier layer 44 may be either a polymer material such as the well known polymers Riston and Vacrel available from the DuPont Company of Wilmington, Del. Alternatively, the barrier layer 44 may be electroformed of nickel in the manner described in the above identified *Hewlett-Packard Journal.*

The thicker or outer barrier layer 44 may be defined either photolithographically using known polymer materials such as those described above, or it may be formed with known electroforming and photoresist and masking techniques using metals such as nickel and configured to include an ink reservoir region indicated as 46 in FIG. 4B. Such electroforming techniques are disclosed, for example, in U.S. Pat. No. 4,694,308 issued to C. S. Chan et al and assigned to the present assignee.

The ink reservoir region 46 is normally aligned with the previously formed resistive heater elements 41. The outer barrier layer 44 is in turn secured using a suitable adhesive (or using the outer barrier layer 44 as its own adjesive) to an outer orifice or nozzle plate 48 with orifices defined using known orifice forming techniques such as those described in U.S. Pat. No. 4,694,308. These orifices will typically be defined by a plurality of convergent outer surfaces 50 which terminate at a corresponding plurality of output ink ejection orifice openings 52. The orifice plate 48 may be electroformed of nickel or it may be formed of other materials, such as plastics or other photodefinable polymers. Thus, it will be understood that the present invention is not limited by the particular materials and geometries of the outer barrier layer 44 and orifice plate 48 materials for the components 44 and 48 of the above described printhead.

The following table of values is given by way of example only for one printhead of the type described herein which has been actually built and successfully tested.

TABLE

| LAYER | THICKNESS (microns) | APPROXIMATE RESISTIVITY | DEPOSITION PROCESS |
|---|---|---|---|
| 12 Si Wafer | 525 | 38 ohm.cm | Std. substrate |
| 14 SiO2 | 1.7 | N.A. | Thermal Oxidation |
| 16 TaAl | 0.1 | 300 micro-ohm-cm | Sputtering |
| 18 Al | 0.5 | 3 micro-ohm-cm | Sputtering |
| 42 Passivation Si3N4 | 0.5 | N.A. | PECVD* |
| 42 Passivation SiC | 0.25 | N.A. | PECVD* |
| 44 Barrier (Vacrel)** | 25 | N.A. | Lamination |
| 48 Orifice Plate Au plated Ni | 48 | N.A. | Electroplating |

*Plasma Enhanced Chemical Vapor Deposition
**Tradename of polymer barrier material made by the DuPont Co.

We claim:

1. A process for fabricating a thin film resistor device which comprises the steps of:
   a. forming a layer of resistive material on top of a selected substrate,
   b. forming a layer of conductive material on top of said resistive layer,
   c. defining a pattern in said conductive layer including discontinuous strips of conductor which extend to each side of and define a first dimension of a resistive heater element,
   d. completely covering said conductive strips with a mask to leave exposed only a predetermined area of said resistive layer removed from said conductive strips, and
   e. removing said predetermined area of said resistive layer to thereby define a second dimension of said resistive heater element; whereby said resistive heater element is protected during the etching step used to define its second dimension.

2. The process described in claim 1 wherein an ink jet printhead is formed by first depositing a barrier layer on said device to define an ink reservoir over said resistive heater element, and then depositing an orifice plate on said barrier layer to position an orifice opening over said ink reservoir and said resistive heater element.

3. An ink jet printhead for an ink jet printer and having a thin film resistor substructure for receiving in succession a barrier layer and orifice plate for ejecting ink onto a print medium, characterized in that said thin film resistor substructure is fabricated by the process of:
   a. forming a layer of resistive material on top of a selected substrate,
   b. forming a layer of conductive material on top of said resistive layer,
   c. defining a pattern in said conductive layer including discontinuous strips of conductor which extend to each side of and define a first dimension of a resistive heater element,
   d. completely covering said conductive strips with a mask to leave exposed only a predetermined area of said resistive layer removed from said conductive strips, and then
   e. removing said predetermined area of said resistive layer to thereby define a second dimension of said resistive heater element.

4. A process for defining the X and Y lateral dimensions of a planar transducer element formed in a layer of selected transducer material which comprises the steps of:
   a. providing at least two conductive strips on said layer and having spaced apart ends which define an X dimension of said transducer element,
   b. masking said conductive strips and an adjacent region of said layer to completely cover said strips and to provide protection therefor,
   c. removing unmasked regions of said layer to thereby define a Y dimension of said transducer element, and
   d. removing the mask from said conductive strips, whereby the X-Y area of said transducer element is always protected during the definition thereof.

* * * * *